US012610685B2

(12) United States Patent
Fan et al.

(10) Patent No.: US 12,610,685 B2
(45) Date of Patent: Apr. 21, 2026

(54) DISPLAY PANELS, TRANSPARENT DISPLAY PANELS AND MANUFACTURING METHODS THEREFOR

(71) Applicant: BOE Technology Group Co., Ltd., Beijing (CN)

(72) Inventors: Xing Fan, Beijing (CN); Ying Bao, Beijing (CN); Ming Zhao, Beijing (CN); Qixiao Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 465 days.

(21) Appl. No.: 17/788,567

(22) PCT Filed: Jun. 4, 2021

(86) PCT No.: PCT/CN2021/098452
§ 371 (c)(1),
(2) Date: Jun. 23, 2022

(87) PCT Pub. No.: WO2021/249312
PCT Pub. Date: Dec. 16, 2021

(65) Prior Publication Data
US 2023/0039218 A1      Feb. 9, 2023

(30) Foreign Application Priority Data

Jun. 11, 2020    (CN) .......................... 202010532070.7

(51) Int. Cl.
*H10K 59/131* (2023.01)
*H10K 50/80* (2023.01)
(Continued)

(52) U.S. Cl.
CPC ........... *H10K 50/80* (2023.02); *H10K 59/131* (2023.02); *H10K 59/179* (2023.02); *H10K 71/00* (2023.02);
(Continued)

(58) Field of Classification Search
CPC ........ H10K 50/80; H10K 50/88; H10K 59/80; H10K 77/00; H10K 59/131; H10K 59/12;
(Continued)

(56) References Cited

U.S. PATENT DOCUMENTS 6,635,990 B1 * 10/2003 Pichler .................. H10K 59/60
313/506
9,431,454 B1      8/2016 Ueno et al.
(Continued)

FOREIGN PATENT DOCUMENTS

CN      106684260 A      5/2017
CN      109599035 A      4/2019
(Continued)

OTHER PUBLICATIONS

CN2020105320707 first office action.
PCT/CN2021/098452 international search report.

*Primary Examiner* — Matthew C Landau
*Assistant Examiner* — David W Ward
(74) *Attorney, Agent, or Firm* — IPro, PLLC

(57) ABSTRACT

The present application provides display panels, transparent display panels and manufacturing methods therefor. A transparent display panel includes a light transmitting substrate, pixel structures, second electrode connecting portions, and a nano-material layer. A display region of the light transmitting substrate includes alternately distributed pixel regions and non-pixel regions. The pixel structures are in the pixel regions, each including: a first electrode close to the light transmitting substrate, a second electrode away from the light transmitting substrate, and a light emitting block between the first electrode and the second electrode. The second electrode connecting portions are located in the non-pixel regions, and connect adjacent second electrodes. The nano-material layer includes nano-island structures separated from each other, and is at least on a side of the second electrode connecting portions away from the light transmitting substrate, and is configured to excite surface plasma polaritons corresponding to infrared light and scatter the infrared light.

16 Claims, 12 Drawing Sheets

(51) Int. Cl.

| | |
|---|---|
| *H10K 59/179* | (2023.01) |
| *H10K 71/00* | (2023.01) |
| *H10K 59/12* | (2023.01) |
| *H10K 59/35* | (2023.01) |

(52) U.S. Cl.
CPC ....... *H10K 59/1201* (2023.02); *H10K 59/351* (2023.02)

(58) Field of Classification Search
CPC .... H10K 59/179; H10K 59/17; H10K 59/351; H10K 50/85–858; H10K 50/828; H10K 50/86; H10K 59/80524; H10K 71/00; H10K 59/1201; H10K 71/40; H10K 71/421; H10K 71/441; G01N 21/553; G01N 21/554; G01N 21/658
See application file for complete search history.

(56) References Cited

U.S. PATENT DOCUMENTS

| | | | | |
|---|---|---|---|---|
| 2009/0002701 | A1* | 1/2009 | Fattal ................... | G01N 21/554 |
| | | | | 385/37 |
| 2011/0042696 | A1* | 2/2011 | Smith ................. | H10K 50/852 |
| | | | | 257/88 |
| 2011/0217544 | A1* | 9/2011 | Young .................... | H10F 77/45 |
| | | | | 977/773 |
| 2012/0097990 | A1* | 4/2012 | Koh ................... | H10K 59/8791 |
| | | | | 257/40 |
| 2012/0314189 | A1* | 12/2012 | Natsumeda .......... | H10H 20/855 |
| | | | | 257/E33.068 |
| 2014/0151678 | A1* | 6/2014 | Sakuma ............... | H10K 71/191 |
| | | | | 438/46 |
| 2014/0226197 | A1* | 8/2014 | Natsumeda .......... | G03B 21/204 |
| | | | | 359/241 |
| 2016/0254309 | A1* | 9/2016 | Ueno ................ | H01L 27/14627 |
| | | | | 250/332 |
| 2017/0062679 | A1* | 3/2017 | Lee ..................... | H01L 25/0753 |
| 2019/0067404 | A1* | 2/2019 | Lee .................. | H10K 59/80518 |
| 2019/0341435 | A1 | 11/2019 | Chang et al. | |
| 2021/0013277 | A1* | 1/2021 | Liu .................. | H10K 59/80515 |
| 2021/0193949 | A1 | 6/2021 | Huang et al. | |
| 2023/0097317 | A1* | 3/2023 | Motoyama .......... | H10K 59/879 |
| | | | | 257/40 |

FOREIGN PATENT DOCUMENTS

| | | |
|---|---|---|
| CN | 110600508 A | 12/2019 |
| CN | 110867528 A | 3/2020 |
| CN | 111584611 A | 8/2020 |

* cited by examiner

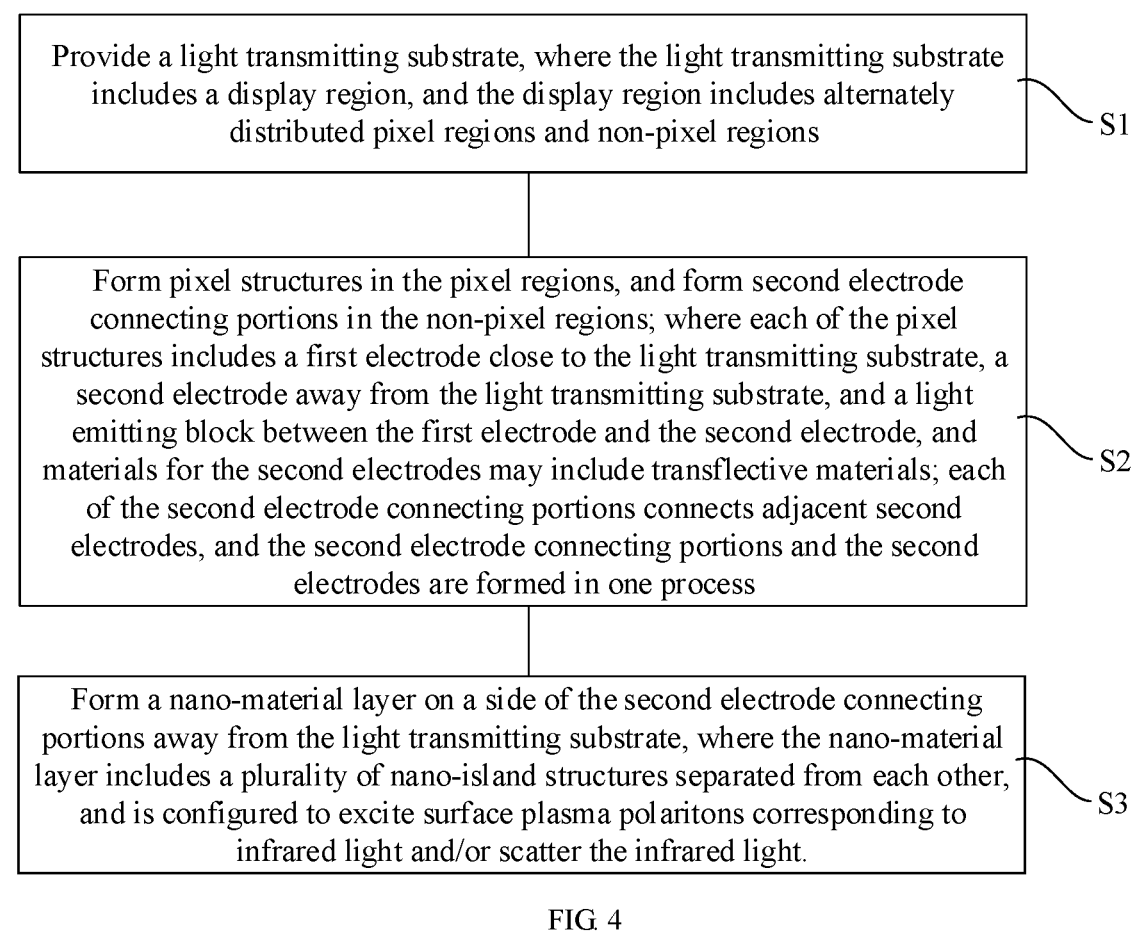

Provide a light transmitting substrate, where the light transmitting substrate includes a display region, and the display region includes alternately distributed pixel regions and non-pixel regions ⟍ S1

Form pixel structures in the pixel regions, and form second electrode connecting portions in the non-pixel regions; where each of the pixel structures includes a first electrode close to the light transmitting substrate, a second electrode away from the light transmitting substrate, and a light emitting block between the first electrode and the second electrode, and materials for the second electrodes may include transflective materials; each of the second electrode connecting portions connects adjacent second electrodes, and the second electrode connecting portions and the second electrodes are formed in one process ⟍ S2

Form a nano-material layer on a side of the second electrode connecting portions away from the light transmitting substrate, where the nano-material layer includes a plurality of nano-island structures separated from each other, and is configured to excite surface plasma polaritons corresponding to infrared light and/or scatter the infrared light. ⟍ S3

FIG. 4

DISPLAY PANELS, TRANSPARENT DISPLAY PANELS AND MANUFACTURING METHODS THEREFOR

CROSS-REFERENCE TO RELATED APPLICATIONS

This application is a national stage of international PCT Application No. PCT/CN2021/098452 filed on Jun. 4, 2021, the entire contents of which are incorporated herein by reference.

This application claims priority to Chinese patent application No. 202010532070.7 entitled "DISPLAY PANELS, TRANSPARENT DISPLAY PANELS AND MANUFACTURING METHODS THEREFOR", filed on Jun. 11, 2020, the entire contents of which are incorporated herein by reference.

TECHNICAL FIELD

The present application relates to the field of display device technologies, and in particular, to display panels, transparent display panels and manufacturing methods therefor BACKGROUND Currently, there are more and more demands for 3D stereo vision applications, such as face identification, 3D motion sensing games and photography, in the field of display. TOF (time of flight) is related to realization of 3D stereo vision experiences. A principle of TOF technologies is to emit laser light to an object by an emitter, and receive a reflected laser signal by a sensor, then calculate a distance between the object and a mobile phone according to a round-trip time of the light, thereby determining a reflection point. When enough laser light is emitted, all points can be connected with each other to form a 3D surface. A signal wavelength of a TOF device is generally in an infrared band (e.g., 940 nm).

SUMMARY

A first aspect of examples of the present application provides a transparent display panel, including: a light transmitting substrate including a display region, where the display region includes alternately distributed pixel regions and non-pixel regions; pixel structures located in the pixel regions, where each of the pixel structures includes: a first electrode close to the light transmitting substrate, a second electrode away from the light transmitting substrate, and a light emitting block between the first electrode and the second electrode, and one or more materials for second electrodes include one or more transflective materials; second electrode connecting portions located in the non-pixel regions, where each of the second electrode connecting portions connects adjacent second electrodes, and one or more materials for the second electrode connecting portions are the same as the one or more materials for the second electrodes; and a nano-material layer including a plurality of nano-island structures separated from each other, where the nano-material layer is located at least on a side of the second electrode connecting portions away from the light transmitting substrate, and is configured to excite surface plasma polaritons corresponding to infrared light.

Optionally, the one or more materials for the second electrode connecting portions are different from one or more materials for the nano-material layer; the one or more materials for the second electrode connecting portions include at least one of magnesium, silver or aluminum; the one or more materials for the nano-material layer include at least one of gold, silver, lead, aluminum or magnesium.

Optionally, the nano-island structures are periodically or non-periodically distributed; and/or the nano-island structures are cuboids, cubes, cones, prismoids or hemispheroids.

Optionally, a light emitting mode of the pixel structures is an Active Matrix mode, and the second electrodes and the second electrode connecting portions are connected with each other to form a planar electrode.

Optionally, the nano-material layer is provided on a side of the second electrodes away from the light transmitting substrate.

Optionally, a light emitting mode of the pixel structures is a Passive Matrix mode; and the non-pixel regions include first electrode connecting portions, respective first electrodes and corresponding first electrode connecting portions located in a same first direction are connected with each other to form a strip electrode, and respective second electrodes and corresponding second electrode connecting portions located in a same second direction are connected with each other to form a strip electrode, where the second direction is perpendicular to the first direction.

Optionally, the nano-material layer is provided on a side of the second electrodes away from the light transmitting substrate.

A second aspect of the examples of the present application provides a display panel, including: a transparent display region and a non-transparent display region, where the transparent display region includes the transparent display panel according to any of the above descriptions.

A third aspect of the examples of the present application provides a method of manufacturing a transparent display panel, including: providing a light transmitting substrate including a display region, where the display region includes alternately distributed pixel regions and non-pixel regions; forming pixel structures in the pixel regions, and forming second electrode connecting portions in the non-pixel regions, where each of the pixel structures includes a first electrode close to the light transmitting substrate, a second electrode away from the light transmitting substrate, and a light emitting block between the first electrode and the second electrode, and one or more materials for second electrodes include one or more transflective materials, each of the second electrode connecting portions connects adjacent second electrodes, and the second electrode connecting portions and the second electrodes are formed in one process; and forming a nano-material layer at least on a side of the second electrode connecting portions away from the light transmitting substrate, where the nano-material layer includes a plurality of nano-island structures separated from each other.

Optionally, the nano-island structures are formed by evaporation, etching or laser ablation.

Optionally, one or more materials for the second electrode connecting portions are different from one or more materials for the nano-material layer; the one or more materials for the second electrode connecting portions include at least one of magnesium, silver or aluminum; and the one or more materials for the nano-material layer include at least one of gold, silver, lead, aluminum or magnesium.

Optionally, the nano-island structures are periodically or non-periodically distributed; and/or the nano-island structures are cuboids, cubes, cones, prismoids or hemispheroids.

Optionally, a light emitting mode of the pixel structures is an Active Matrix mode; and forming the pixel structures in the pixel regions, and forming the second electrode connecting portions in the non-pixel regions includes: connecting the second electrodes with the second electrode connecting portions to form a planar electrode.

Optionally, the method further includes: forming the nano-material layer on a side of the second electrodes away from the light transmitting substrate.

Optionally, a light emitting mode of the pixel structures is a Passive Matrix mode; and forming the pixel structures in the pixel regions, and forming the second electrode connecting portions in the non-pixel regions includes: forming first electrode connecting portions in the non-pixel regions, so that respective first electrodes and corresponding first electrode connecting portions located in a same first direction are connected with each other to form a strip electrode, and forming the second electrode connecting portions in the non-pixel regions, so that respective second electrodes and corresponding second electrode connecting portions located in a same second direction are connected with each other to form a strip electrode, where the second direction is perpendicular to the first direction.

Optionally, the method further includes: forming the nano-material layer on a side of the second electrodes away from the light transmitting substrate.

It should be understood that the above general description and the following detailed description are only exemplary and explanatory and are not restrictive of the present application.

BRIEF DESCRIPTION OF THE DRAWINGS

The accompanying drawings, which are incorporated in and constitute a part of this specification, illustrate examples consistent with the present application and, together with the description, serve to explain the principles of the application.

FIG. 4 is a flowchart illustrating a method of manufacturing a transparent display panel according to an example of the present application.

DETAILED DESCRIPTION OF THE EMBODIMENTS

Figure 1:
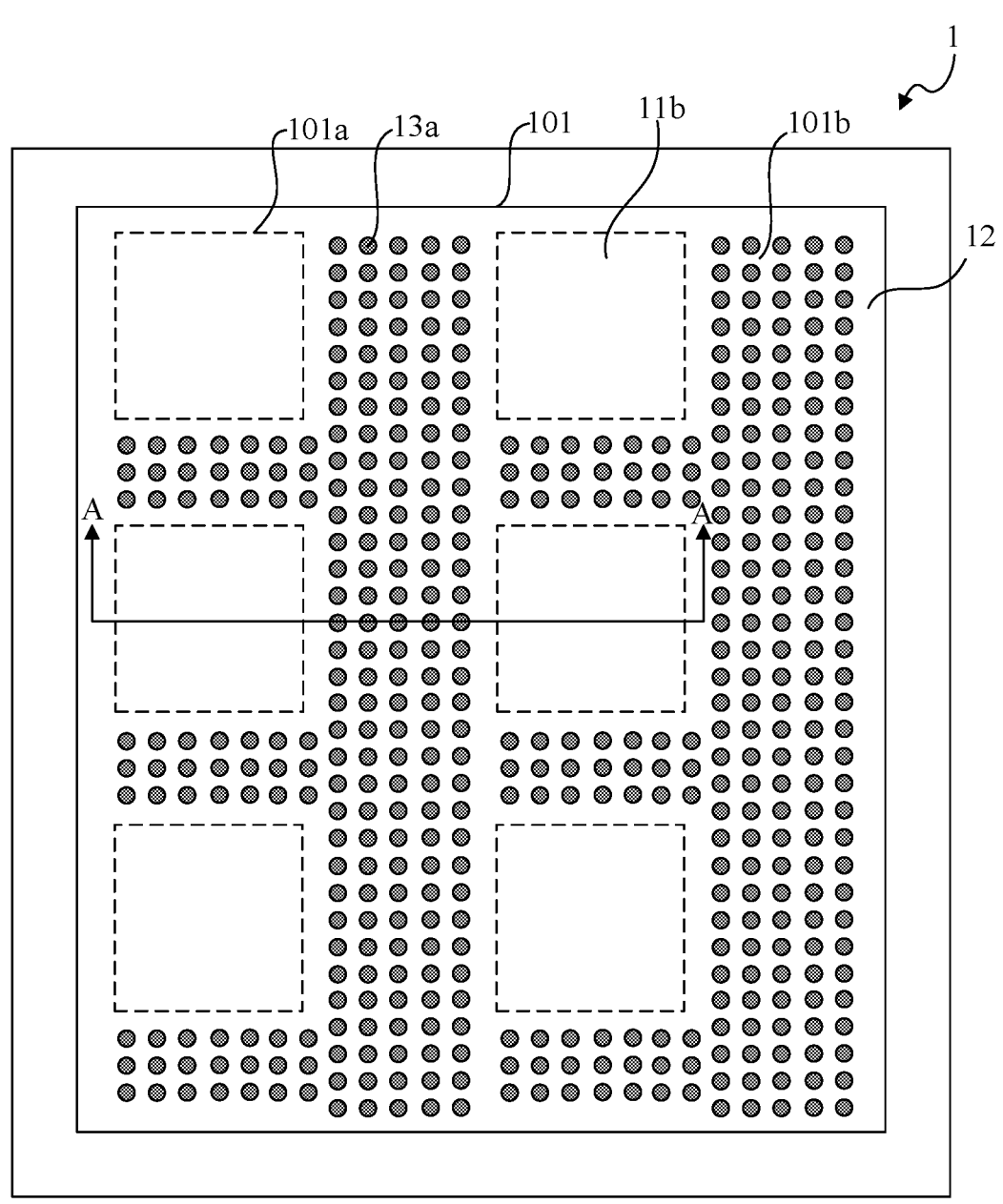
FIG. 1 is a schematic top view illustrating a transparent display panel according to an example of the present application.

Exemplary embodiments will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present application. Rather, they are merely examples of apparatuses and methods consistent with some aspects of the present application as detailed in the appended claims.

When a TOF device is provided under a screen, emitted light first transmits through the screen to reach an external detected object, and then reflected light transmits through the screen to reach an Under Screen Receiving Sensor. To receive relatively strong reflected light, it is necessary for the screen to have high transmittance to light in an infrared band.

A top electrode structure of commonly used organic light emitting diodes is a semi-transparent metal film, which has transmittances of about 40%-60% to light in a visible light band and about 20%-40% to light in the infrared band. This restricts the transmittance of the entire screen, especially the transmittance to light in the infrared band. At present, the transmittance of the screen to light in the infrared band is only about 20-30%, which cannot satisfy application requirements of Under Screen TOF. It should be noted that the infrared light in this application refers to light having a wavelength greater than 620 nm.

Figure 2:
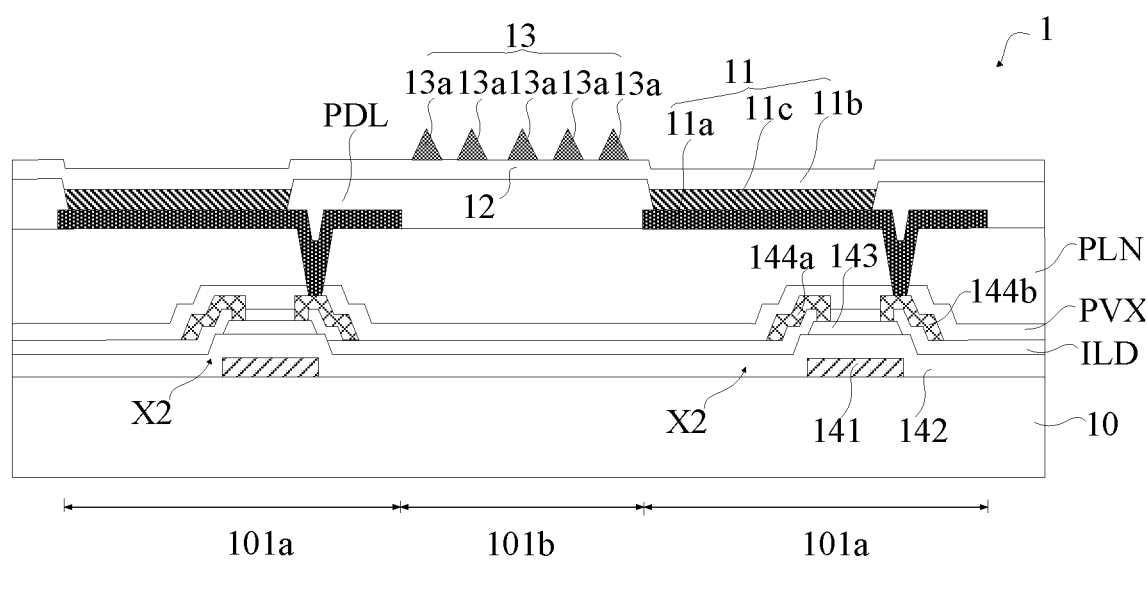
FIG. 2 is a cross-sectional view taken along a line AA in FIG. 1.

FIG. 1 is a schematic top view illustrating a transparent display panel according to an example of the present application. FIG. 2 is a cross-sectional view taken along a line AA in FIG. 1.

Referring to FIGS. 1 and 2, a transparent display panel 1 includes:

a light transmitting substrate 10 including a display region 101, where the display region 101 includes alternately distributed pixel regions 101*a* and non-pixel regions 101*b*;

pixel structures 11 located in the pixel regions 101*a*, where each of the pixel structures 11 includes: a first electrode 11*a* close to the light transmitting substrate 10, a second electrode 11*b* away from the light transmitting substrate 10, and a light emitting block 11*c* between the first electrode 11*a* and the second electrode 11*b*, and materials for the second electrodes 11*b* include transflective materials;

second electrode connecting portions 12 located in the non-pixel regions 101*b*, where each of the second electrode connecting portions 12 connects adjacent second electrodes 11*b*, and materials for the second electrode connecting portions 12 are the same as that for the second electrodes 11*b*; and a nano-material layer 13 including a plurality of nano-island structures 13*a* separated from each other, where the nano-material layer 13 is located at least on a side of the second electrode connecting portions 12 away from the light transmitting substrate 10, and is configured to excite surface plasma polaritons corresponding to infrared light and further configured to scatter the infrared light.

Referring to FIGS. 1 and 2, the light transmitting substrate 10 may be a flexible substrate or a rigid substrate. Materials for the flexible substrate may be polyimide, and materials for the rigid substrate may be glass.

In some examples, the light transmitting substrate 10 may further include a non-display region (not shown) surrounding the display region 101. The non-display region can be provided with circuits, such as gate drive circuits. In some examples, the light transmitting substrate 10 may include only the display region 101. The circuits are arranged in the display region 101 or integrated in other chips.

A planarization layer PLN is provided on the light transmitting substrate 10. The first electrodes 11a are provided on a side of the planarization layer PLN away from the light transmitting substrate 10. A pixel definition layer PDL is provided on the first electrodes 11a and the planarization layer PLN not covered with the first electrodes 11a. The pixel definition layer PDL has openings each exposing a partial region of a corresponding first electrode 11a, and the light emitting blocks 11c are provided in the openings. The second electrodes 11b and the second electrode connecting portions 12 are provided on the light emitting blocks 11c and the pixel definition layer PDL.

The light emitting blocks 11c may be red, green or blue, or be red, green, blue or yellow. The pixel structures 11 with three primary colors of red, green and blue or four primary colors of red, green, blue and yellow are alternately distributed. Materials for the light emitting blocks 11c may be organic light emitting materials (OLED).

Materials for the planarization layer PLN and the pixel definition layer PDL may be transparent materials, such as polyimide.

The first electrodes 11a may be anodes and their materials are light transmitting materials or light reflecting materials. The light transmitting materials may be at least one of indium tin oxide (ITO), indium zinc oxide (IZO), or indium gallium zinc oxide (IGZO). The light reflecting materials may be silver (Ag) and its alloys, and aluminum (Al) and its alloys, such as silver (Ag), an alloy of silver and lead (Ag:Pb), an alloy of aluminum and neodymium (Al:Nd), and an alloy of silver, platinum and copper (Ag:Pt:Cu). When silver and its alloys are used as the light reflecting materials, a layer of ITO, IZO or IGZO may be provided between the first electrodes 11a and the light emitting blocks 11c.

The second electrodes 11b may be cathodes, and their materials may be materials having functions of partial light transmission and partial light reflection (transflective materials). The second electrodes 11b each may have a single-layer structure, and materials for the single-layer structure may include at least one of magnesium, silver or aluminum, for example, a mixture of magnesium and silver or a mixture of aluminum and silver. The second electrodes 11b each may have a three-layer structure composed of a transparent conductive layer, an intermediate layer, and a transparent conductive layer. Materials for the transparent conductive layer may be at least one of ITO, IZO or IGZO. Materials for the intermediate layer include at least one of magnesium, silver or aluminum, for example, a mixture of magnesium and silver or a mixture of aluminum and silver. In other words, the transparent display panel 1 has a top light emission structure.

In this example, a light emitting mode of the pixel structures 11 is an Active Matrix (AM) mode. Therefore, pixel driving circuits are provided between the first electrodes 11a and the light transmitting substrate 10.

Figure 3:
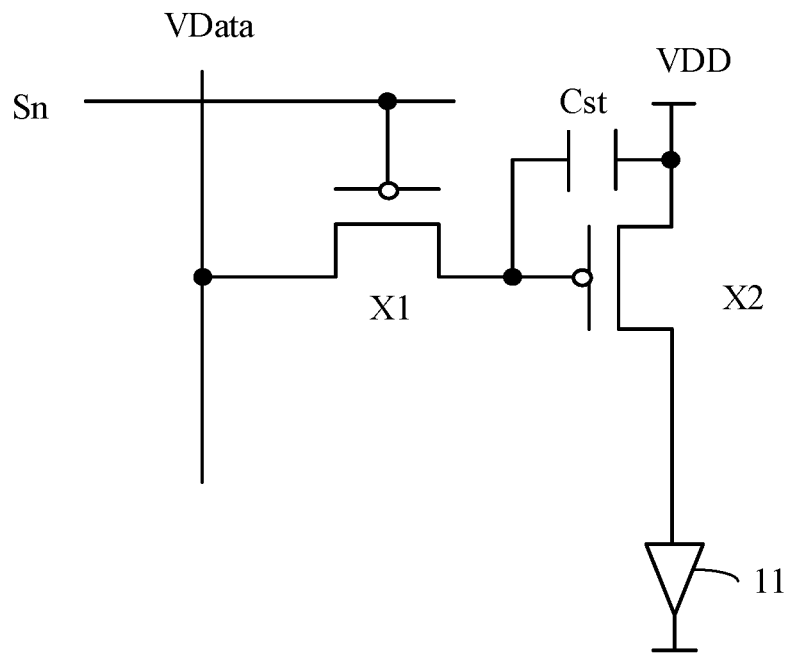
FIG. 3 is a circuit diagram of a pixel driving circuit with a 2T1C structure.

FIG. 3 is a circuit diagram of a pixel driving circuit with a 2T1C structure. Referring to FIG. 3, the pixel driving circuit includes a switch transistor X1, a drive transistor X2 and a storage capacitor Cst.

A gate electrode of the switch transistor X1 is electrically connected with a row scan signal line. When a scan signal Sn of the row scan signal line is at a turn-on voltage, the switch transistor X1 keeps a data signal VData of a column data signal line on a plate of the storage capacitor Cst. When the scan signal Sn is at a turn-off voltage, the data signal kept on the storage capacitor Cst keeps the drive transistor X2 turned on, so that a power signal VDD of a column power signal line continuously supplies power to the first electrode 11a of the pixel structure 11.

Pixel driving circuits for pixel structures 11 with various colors in the same row can be connected with the same row scan signal line, and pixel driving circuits for pixel structures 11 with the same color in the same column can be connected with the same column data signal line and the same column power signal line. In some examples, the storage capacitor Cst may be formed by an overlapping region between a power signal line and a gate electrode of the drive transistor X2.

Referring to FIG. 2, in this example, the drive transistor X2 in the pixel driving circuit includes: a bottom gate 141, a gate insulation layer 142, an active layer 143, an interlayer dielectric layer ILD, a source electrode 144a, a drain electrode 144b, and a passivation layer PVX. Each layer in the switch transistor X1 may be located in the same layer as the same functional layer in the drive transistor X2. In other words, the switch transistor X1 and the drive transistor X2 have a bottom gate structure.

A drain electrode 144b of the switch transistor X1 and the source electrode 144a of the drive transistor X2 may be connected with each other through a conductive plug and a metal interconnection layer.

In some examples, one of the switch transistor X1 and the drive transistor X2 may have a bottom gate structure, and the other one may have a top gate structure, or both of them may have a top gate structure.

In some examples, pixel driving circuits for the pixel structures 11 may be circuit structures in related technologies, such as 3T1C, 5T2C, 6T1C and 7T1C, which are not limited in this example.

Referring to FIG. 1, in this example, respective second electrodes 11b are connected with corresponding second electrode connecting portions 12 to form a planar electrode, so as to facilitate the application of voltage to respective second electrodes 11b.

In some examples, in both row and column directions, a width of the second electrode connecting portion 12 is equal to that of the second electrode 11b.

In other examples, in the row and/or column direction(s), the width of the second electrode connecting portion 12 is smaller than that of the second electrode 11b. In other words, the planar electrode has hollow regions.

Materials for the second electrode connecting portions 12 are the same as that for the second electrodes 11b.

In some examples, both the second electrode connecting portions 12 and the second electrodes 11b have a single-layer structure, and materials for the single-layer structure include at least one of magnesium, silver or aluminum, for example, a mixture of magnesium and silver or a mixture of aluminum and silver. In addition, the materials for the single-layer structure may be doped with other metals, such as calcium.

In other examples, both the second electrode connecting portions 12 and the second electrodes 11b have a three-layer structure composed of a transparent conductive layer, an intermediate layer, and a transparent conductive layer. Materials for the transparent conductive layer may be at least one of ITO, IZO or IGZO, and materials for the intermediate layer include at least one of magnesium, silver or aluminum, for example, a mixture of magnesium and silver or a mixture of aluminum and silver. In addition, the materials for the intermediate layer may be doped with other metals, such as calcium.

In some examples, a light emitting mode of the pixel structures 11 is a Passive Matrix (PM) mode. Therefore, there are no pixel driving circuits between the first electrodes 11a and the light transmitting substrate 10.

The nano-material layer 13 includes a plurality of nano-island structures 13a. In some examples, the nano-island structures 13a that are separated from each other in at least some regions are periodically distributed for forming gratings, and the nano-island structures 13a in other regions are non-periodically distributed for forming rough surfaces. In other examples, all nano-island structures 13a that are separated from each other are non-periodically distributed for forming rough surfaces.

In some examples, materials for the nano-material layer 13 may be at least one of Au, Ag, Pb, Al or Mg.

In this example, each nano-island structure 13a is a cone. In other examples, the nano-island structures 13a are cuboids, cubes, prismoids or hemispheroids.

In some examples, a capping layer (CPL) or an encapsulation layer (e.g., TFE film) may be provided on a side of the nano-material layer 13 and second electrodes 11b away from the light transmitting substrate 10.

If the nano-material layer 13 is not provided on the side of the second electrode connecting portions 12 away from the light transmitting substrate 10, when infrared light propagates to interfaces between metals (the second electrode connecting portions 12) and a medium (e.g., the capping layer or the encapsulation layer), Surface Plasma Polaritons (SPPs) will be generated. The SPPs are a mixed excited state formed by an interaction between free electrons and photons in a metal surface region. That is, under the irradiation of light waves with the same frequency, surface near-free electrons resonate collectively. Because the wave number of SPPs is greater than that of photons in a vacuum or surrounding medium at the same frequency, that is, their wave numbers do not match each other, usually the SPPs cannot be excited and radiated from a metal surface.

In this example, due to the provision of the nano-material layer 13, a plurality of nano-island structures 13a form gratings, which can diffract incident infrared light and change its wave number to match the wave number of SPPs and thus excite the SPPs. Further, infrared light originally confined in the second electrode connecting portions 12 can be emitted, and rough surfaces formed by a plurality of nano-island structures 13a can scatter infrared light, thereby increasing the transmittance of infrared light.

In addition, since a wavelength of infrared light is greater than that of visible light, that is, the wave number of infrared light is smaller than that of visible light, the wave number of diffracted light more easily matches the wave number of SPPs corresponding to infrared light. Therefore, a probability of infrared light emission is greater than that of visible light emission. In other words, the provision of the nano-material layer has little change to the transmittance of visible light, but relatively increases the transmittance of infrared light, so that the nano-material layer is very suitable for application to Under Screen TOF.

To verify the above beneficial effects of this example, a control experiment is carried out in an example of the present application. Structures and parameters of transparent display panels 1 in a sample 1 and a control sample are roughly same, and materials for second electrode connecting portions 12 are magnesium. Their differences lie only in: the sample 1 is provided with a nano-material layer 13, which is made of silver and has a thickness of 2 nm, and the second electrode connecting portion 12 has a thickness of 11 nm; the control sample is not provided with a nano-material layer 13, and the second electrode connecting portion 12 has a thickness of 13 nm.

A table below shows the transmittances of the sample 1 and the control sample when incident wavelengths are 460 nm, 530 nm, 620 nm and 940 nm, respectively.

| Samples | Transmittance at 460 nm | Transmittance at 530 nm | Transmittance at 620 nm | Transmittance at 940 nm |
|---|---|---|---|---|
| Control sample | 50.00% | 46.00% | 42.70% | 33.80% |
| Sample 1 | 50.20% | 42.10% | 45.20% | 52.90% |

It can be seen that the provision of the nano-material layer increases the transmittances when the incident wavelengths are 620 nm and 940 nm.

Figure 5:
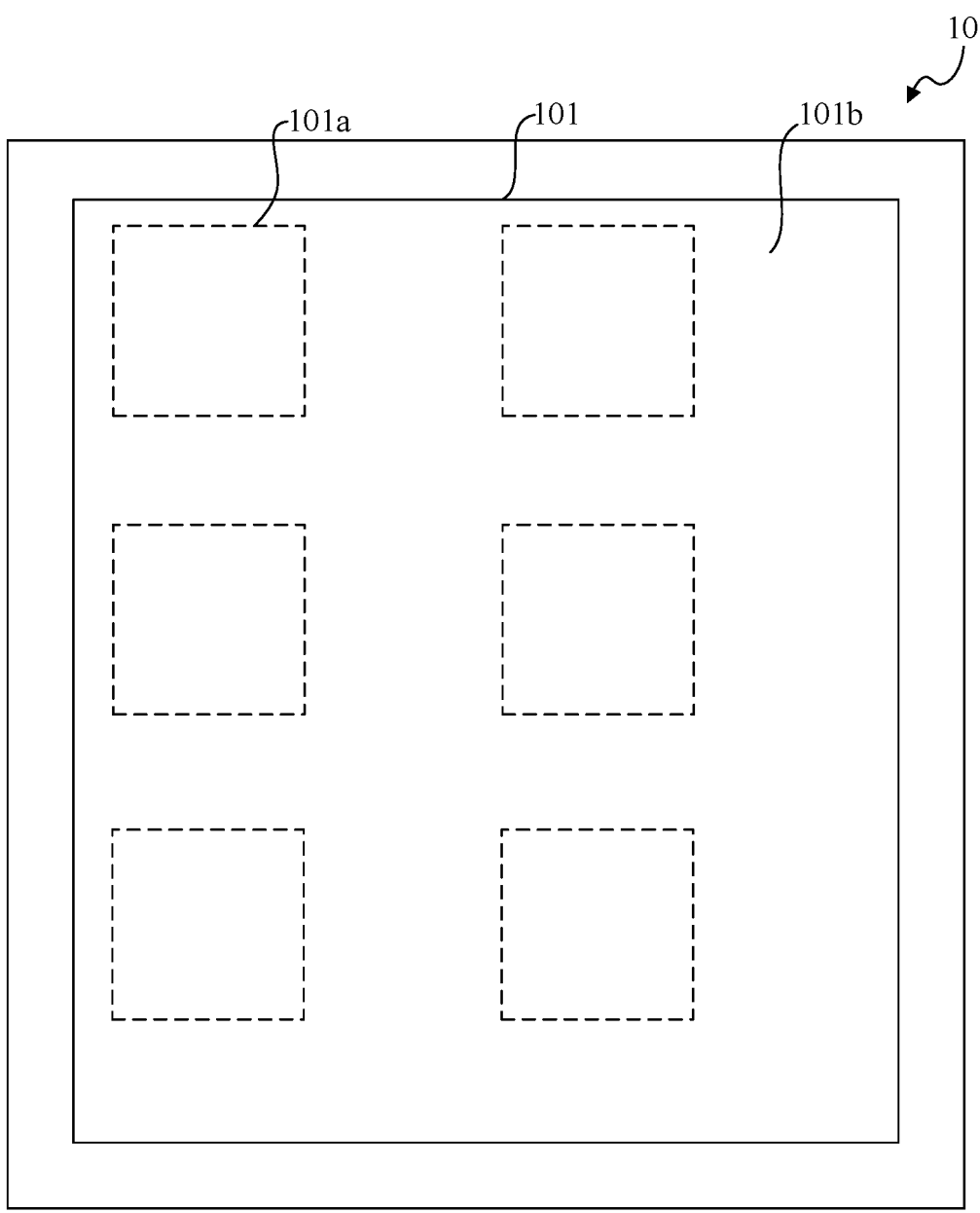
FIGS. 5 and 6 are schematic diagrams of intermediate structures corresponding to processes in FIG. 4.
Figure 6:
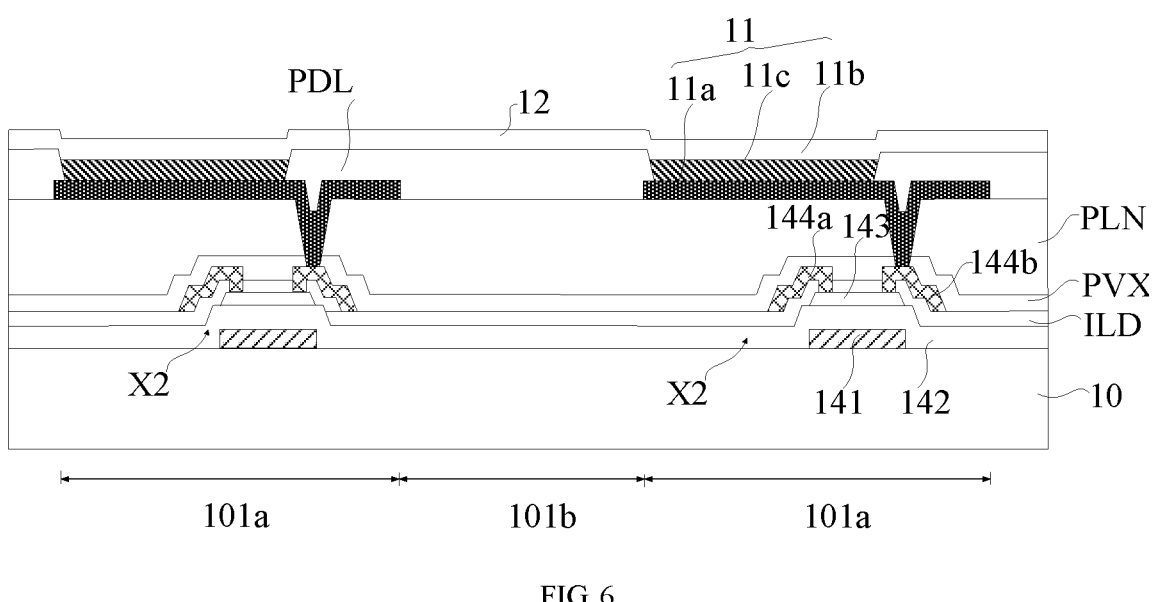

For the transparent display panel 1 shown in FIGS. 1 and 2, an example of the present application provides a manufacturing method. FIG. 4 is a flowchart of a manufacturing method. FIGS. 5 and 6 are schematic diagrams of intermediate structures corresponding to processes in FIG. 4.

First, referring to step S1 in FIG. 4 and FIG. 5, a light transmitting substrate 10 is provided. The light transmitting substrate 10 includes a display region 101, and the display region 101 includes alternately distributed pixel regions 101a and non-pixel regions 101b.

The light transmitting substrate 10 may be a flexible substrate or a rigid substrate. Materials for the flexible substrate may be polyimide, and materials for the rigid substrate may be glass.

In FIG. 5, the pixel regions 101a and the non-pixel regions 101b are alternately distributed in both row and column directions.

In some examples, the pixel regions 101a and the non-pixel regions 101b may be alternately distributed only in the row or column direction.

Next, referring to step S2 in FIG. 4 and FIG. 6, pixel structures 11 are formed in the pixel regions 101a, and second electrode connecting portions 12 are formed in the non-pixel regions 101b. Each pixel structure 11 includes a first electrode 11a close to the light transmitting substrate 10, a second electrode 11b away from the light transmitting substrate 10, and a light emitting block 11c between the first electrode 11a and the second electrode 11b, and materials for the second electrodes 11b may be transflective materials. Each second electrode connecting portion 12 connects adjacent second electrodes 11b, and the second electrode connecting portions 12 and the second electrodes 11b are formed in one process.

In this example, a light emitting mode of the pixel structures 11 is an Active Matrix (AM) mode. The AM mode is also known as an active driving mode. A voltage is applied to the pixel structures 11 by pixel driving circuits, so that the pixel structures 11 emit light. Therefore, before the pixel structures are formed in the pixel regions, pixel driving circuits are first formed in the pixel regions 101a.

The pixel structure 11 is a current-type device, so that the pixel driving circuit includes several transistors and one or more storage capacitors. Below, the 2T1C structure in FIG. 3 is still taken as an example to introduce manufacturing processes of the pixel driving circuit. The step S2 may further include steps S21-S23.

At the step S21, bottom gates 141 are formed respectively in switch transistor regions and drive transistor regions of the pixel regions 101a; a gate insulation layer 142 covering the bottom gates 141 and the light transmitting substrate 10 is formed in the pixel regions 101a and the non-pixel regions 101b; an active layer 143 (including source regions, drain regions, and channel regions between the source regions and the drain regions) is formed respectively in the switch transistor regions and the drive transistor regions; an interlayer dielectric layer ILD covering the active layer 143 and the gate insulation layer 142 is formed in the pixel regions 101a and the non-pixel regions 101b; source electrodes 144a connected with the source regions and drain electrodes 144b connected to the drain regions are formed in the switch transistor regions and the drive transistor regions; a passivation layer PVX covering the source electrodes 144a, the drain electrodes 144b and the interlayer dielectric layer ILD is formed in the pixel regions 101a and the non-pixel regions 101b; conductive plugs and a metal interconnection layer connecting the drain electrodes 144b of the switch transistors X1 and the source electrodes 144a of the drive transistors X2 are formed in the switch transistor regions and the drive transistor regions. The switch transistor regions are regions where the switch transistors are to be formed, and the drive transistor regions are regions where the drive transistors are to be formed.

In some examples, one of the switch transistor X1 and the drive transistor X2 has a bottom gate structure, and the other one has a top gate structure, or both of them have a top gate structure. The top gate structure refers to a transistor structure in which a gate electrode is farther away from the light transmitting substrate 10 than the active layer 143.

Pixel driving circuits for pixel structures 11 with various colors in the same row are connected with the same row scan signal line, and pixel driving circuits for pixel structures 11 with the same color in the same column are connected with the same column data signal line and the same column power signal line. Scan signal lines and the bottom gates 141 may be formed in one process. Data signal lines, power signal lines and the source electrodes 144a/the drain electrodes 144b may be formed in one process. A storage capacitor Cst may be formed by an overlapping region between a power signal line and a gate electrode of a drive transistor X2.

In some examples, pixel driving circuits for the pixel structures 11 may be circuit structures in related technologies, such as 3T1C, 5T2C, 6T1C and 7T1C, which are not limited in this example.

At the step S22, a planarization layer PLN is formed on the metal interconnection layer and the passivation layer PVX.

The planarization layer PLN may be formed by coating. Materials for the planarization layer PLN may be transparent materials, such as polyimide.

At the step S23, a plurality of first electrodes 11a are formed on a side of the planarization layer PLN away from the light transmitting substrate 10, and each pixel region 101a has one first electrode 11a; a pixel definition layer PDL is formed on a side of the first electrodes 11a and the planarization layer PLN away from the light transmitting substrate 10; a plurality of openings are formed in the pixel definition layer PDL, and each pixel region 101a has one opening; light emitting blocks 11c are formed in respective openings; second electrodes 11b and second electrode connecting portions 12 are formed on a side of the light emitting blocks 11c and the pixel definition layer PDL away from the light transmitting substrate 10, where the second electrodes 11b are located in the pixel regions 101a, and the second electrode connecting portions 12 are located in the non-pixel regions 101b.

Regarding the preparation of the first electrodes 11a, a whole first electrode material layer may be first formed by deposition, and then a plurality of first electrode blocks may be formed by dry or wet etching as the first electrodes 11a. The first electrodes 11a may be anodes, and their materials are light transmitting materials or light reflecting materials. The light transmitting materials may be at least one of ITO, IZO or IGZO. The light reflecting materials may include silver (Ag) and its alloys, and aluminum (Al) and its alloys, such as silver (Ag), an alloy of silver and lead (Ag:Pb), an alloy of aluminum and neodymium (Al:Nd), and an alloy of silver, platinum and copper (Ag:Pt:Cu). When silver and its alloys are used as the light reflecting materials, a layer of ITO, IZO or IGZO may be provided between the first electrodes 11a and the light emitting blocks 11c.

The pixel definition layer PDL may be formed by coating, and the openings in the pixel definition layer PDL may be formed by etching. Materials for the pixel definition layer PDL may be transparent materials, such as polyimide.

The light emitting blocks 11c may be formed by evaporation.

Respective second electrodes 11b may be connected with corresponding second electrode connecting portions 12 to form a planar electrode. The second electrodes 11b and the second electrode connecting portions 12 may be formed in one process by sputtering or evaporation, so that their materials may be same. The second electrodes 11b may be cathodes, and their materials are materials having functions of partial light transmission and partial light reflection (transflective materials). The second electrodes 11b each may have a single-layer structure, and materials for the single-layer structure may include at least one of magnesium, silver or aluminum, for example, a mixture of magnesium and silver or a mixture of aluminum and silver; and the materials for the single-layer structure may further be doped with other metals, such as calcium. The second electrodes 11b each may have a three-layer structure composed of a transparent conductive layer, an intermediate layer, and a transparent conductive layer. Materials for the transparent conductive layer may be at least one of ITO, IZO or IGZO. Materials for the intermediate layer include at least one of magnesium, silver or aluminum, for example, a mixture of magnesium and silver or a mixture of aluminum and silver; and the materials for the intermediate layer may further be doped with other metals, such as calcium.

Then, referring to step S3 in FIG. 4, and FIGS. 1 and 2, a nano-material layer 13 is formed on a side of the second electrode connecting portions 12 away from the light transmitting substrate 10. The nano-material layer 13 includes a plurality of nano-island structures 13a separated from each other, and is configured to excite surface plasma polaritons corresponding to infrared light and/or scatter the infrared light.

Materials for the nano-material layer 13 and the second electrode connecting portions 12 are different. Since their materials are different, lattices cannot completely match each other. Therefore, when materials different from that of the second electrode connecting portions 12 are evaporated on the second electrode connecting portions 12, it is more likely to first form the nano-island structures 13a, instead of forming a complete film. In some examples, materials for the nano-material layer 13 may be at least one of Au, Ag, Pb, Al or Mg.

In some examples, the complete film may be formed by extension of evaporation time or by sputtering, physical vapor deposition, chemical vapor deposition, etc., and then the complete film may be patterned by etching or laser ablation to form a plurality of nano-island structures 13a separated from each other.

In some examples, a capping layer (CPL) or an encapsulation layer (e.g., TFE film) may be formed on a side of the nano-material layer 13 and the second electrodes 11b away from the light transmitting substrate 10.

Figure 7A:
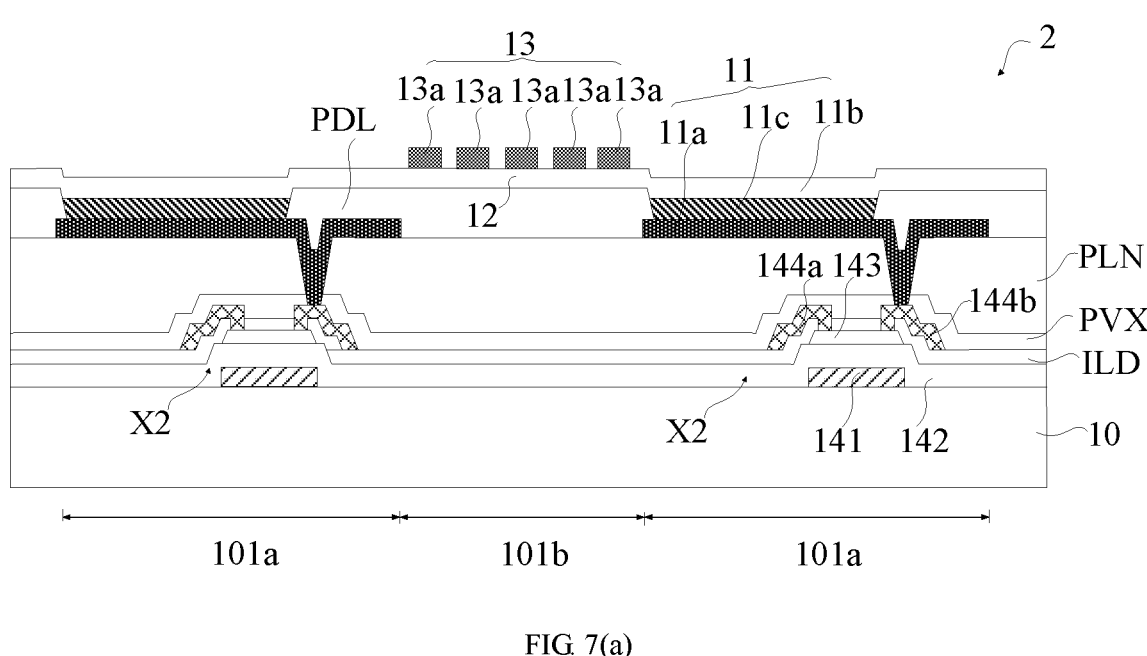
FIGS. 7(*a*) and 7(*b*) are schematic cross-sectional diagrams illustrating two transparent display panels according to another example of the present application.
Figure 7B:
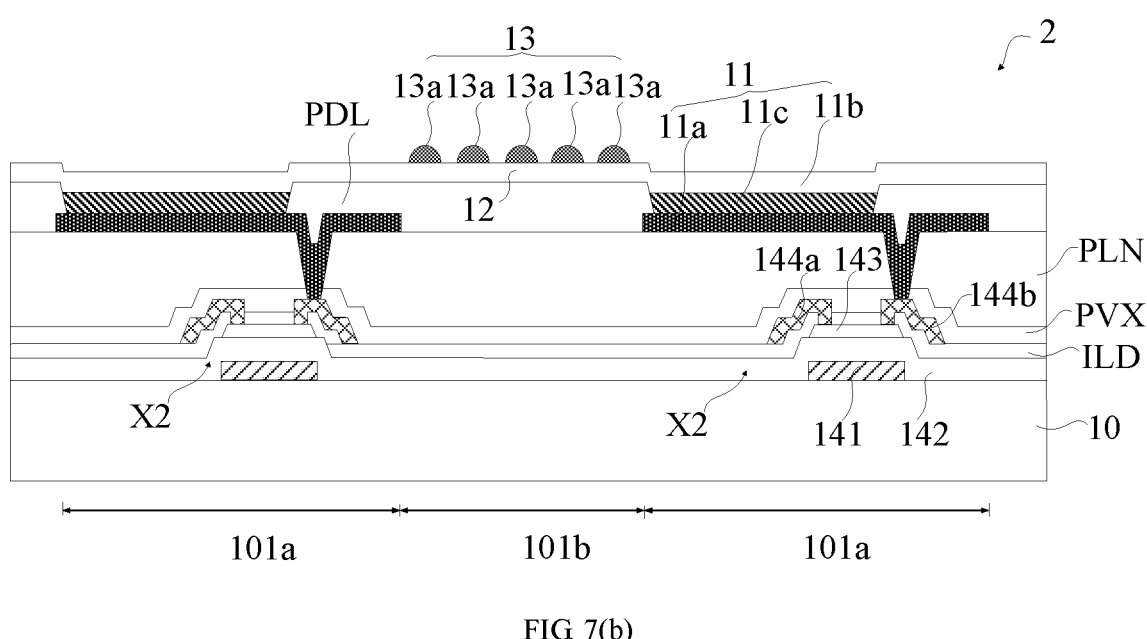

FIG. 7(a) is a schematic cross-sectional diagram illustrating a transparent display panel according to another example of the present application, and FIG. 7(b) is a schematic cross-sectional diagram of another transparent display panel. Referring to FIGS. 7(a) and 7(b), a transparent display panel 2 in this example has substantially the same structure as the transparent display panel 1 in FIGS. 1 to 2, and their difference lies only in that: the nano-island structures 13a in the transparent display panel 2 are cuboids or hemispheroids.

In some examples, the nano-island structures 13a may have other shapes such as cubes or prismoids, which are not limited in this example.

Correspondingly, a manufacturing method of the transparent display panel 2 in this example is substantially the same as that of the transparent display panel 1 in FIGS. 1 to 2, and their differences lie only in that: in the step S3 of manufacturing the transparent display panel 2, a specific shape of the nano-island structures 13a may be controlled further by controlling a material type of the nano-island structures 13a, a density of the nano-island structures 13a during evaporation, an etching solution or gas during etching, and a period of time and a magnitude of energy during ablation.

Figure 8:
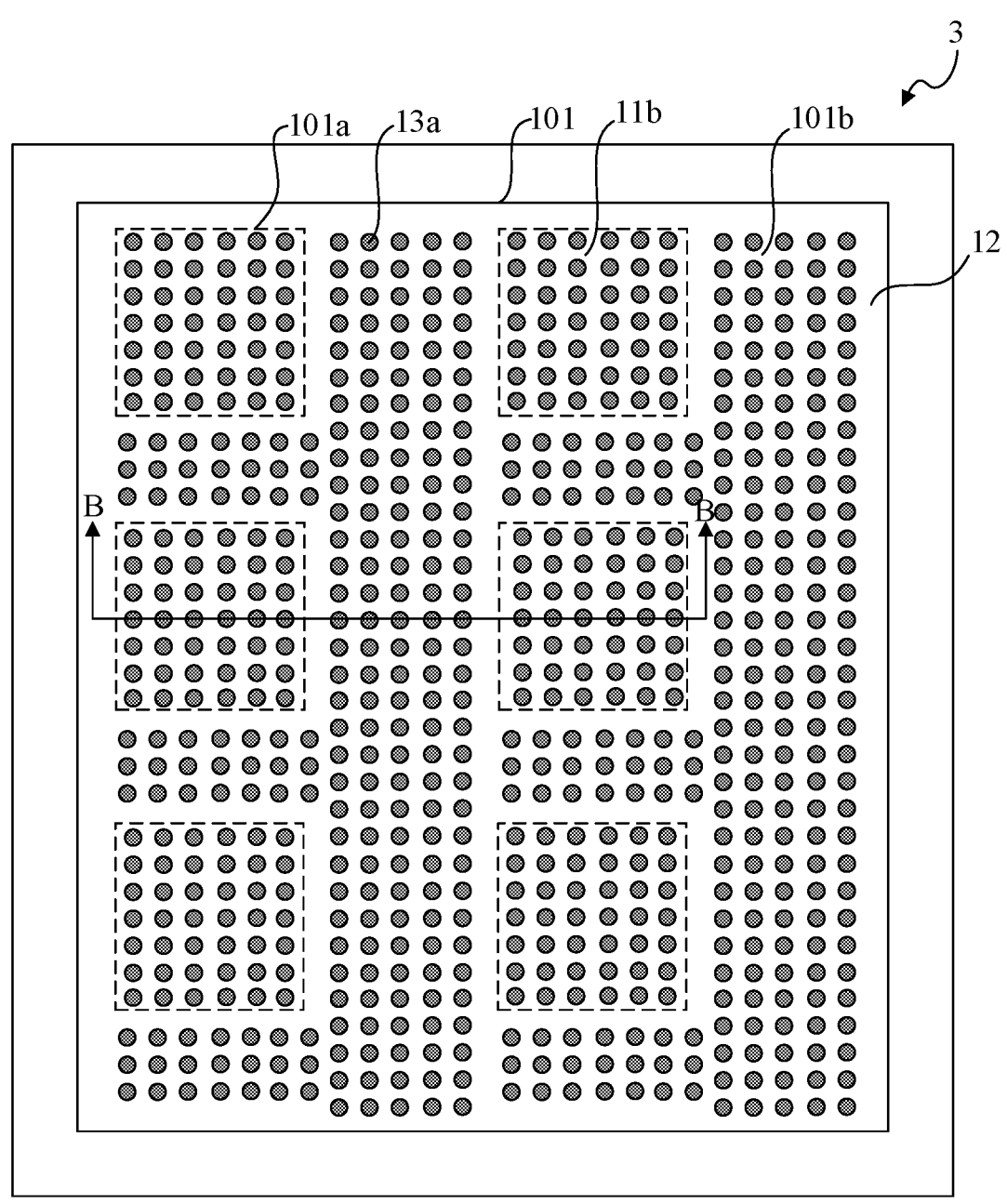
FIG. 8 is a schematic top view illustrating a transparent display panel according to another example of the present application.
Figure 9:
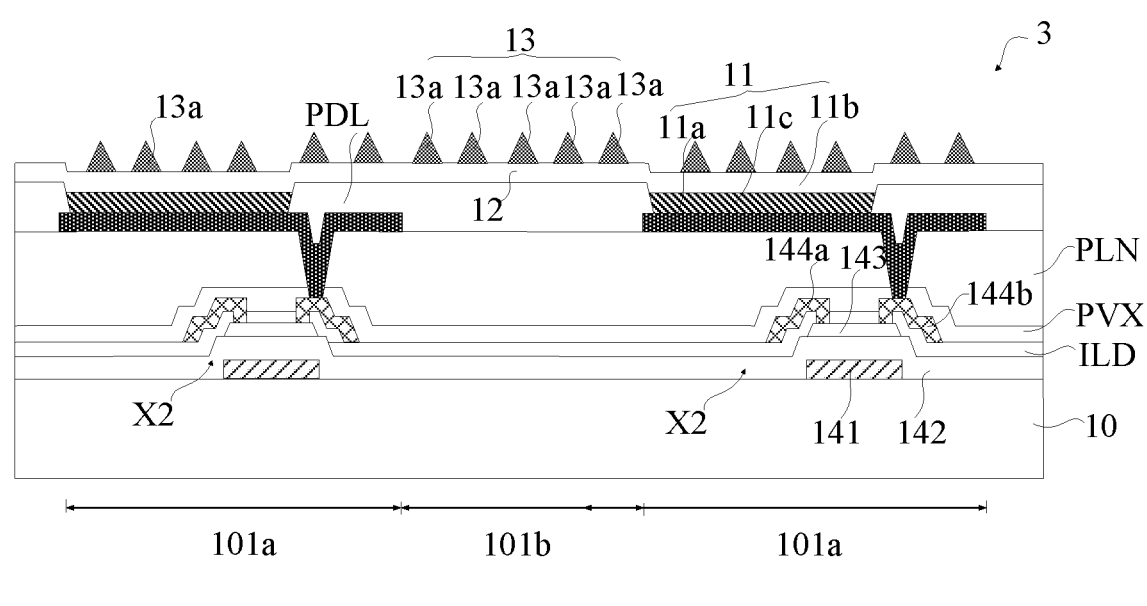
FIG. 9 is a cross-sectional view taken along a line BB in FIG. 8.

FIG. 8 is a schematic top view illustrating a transparent display panel according to another example of the present application. FIG. 9 is a cross-sectional view taken along a line BB in FIG. 8.

Referring to FIGS. 8 and 9, a transparent display panel 3 in this example has substantially the same structure as the transparent display panels 1 and 2 in FIGS. 1, 2, 7(a) and 7(b), and their difference lies only in that: in the transparent display panel 3, the nano-material layer 13 is also provided on a side of the second electrodes 11b away from the light transmitting substrate 10.

The nano-material layer 13 is provided in the pixel regions 101a, and gratings formed by the nano-island structures 13a separated from each other in the nano-material layer, when the pixel structures 11 do not emit light, can diffract incident infrared light and change its wave number to match the wave number of SPPs and thus excite the SPPs. This enables infrared light originally confined in the second electrodes 11b to be emitted, which further increases the transmittance of infrared light in the pixel regions 101a. Rough surfaces formed by a plurality of nano-island structures 13a can scatter infrared light, which further increases the transmittance of infrared light. Therefore, application requirements of Under Screen TOF are more satisfied.

Correspondingly, a manufacturing method of the transparent display panel 3 in this example is substantially the same as that of the transparent display panels 1 and 2 in FIGS. 1, 2, 7(a) and 7(b), and their difference lies only in that: in the step S3 of manufacturing the transparent display panel 3, when the nano-material layer 13 is formed on a side of the second electrode connecting portions 12 away from the light transmitting substrate 10, the nano-material layer 13 is also formed on a side of the second electrodes 11b away from the light transmitting substrate 10.

For a forming method of the nano-material layer 13, reference may be made to that in the above examples.

Figure 10:
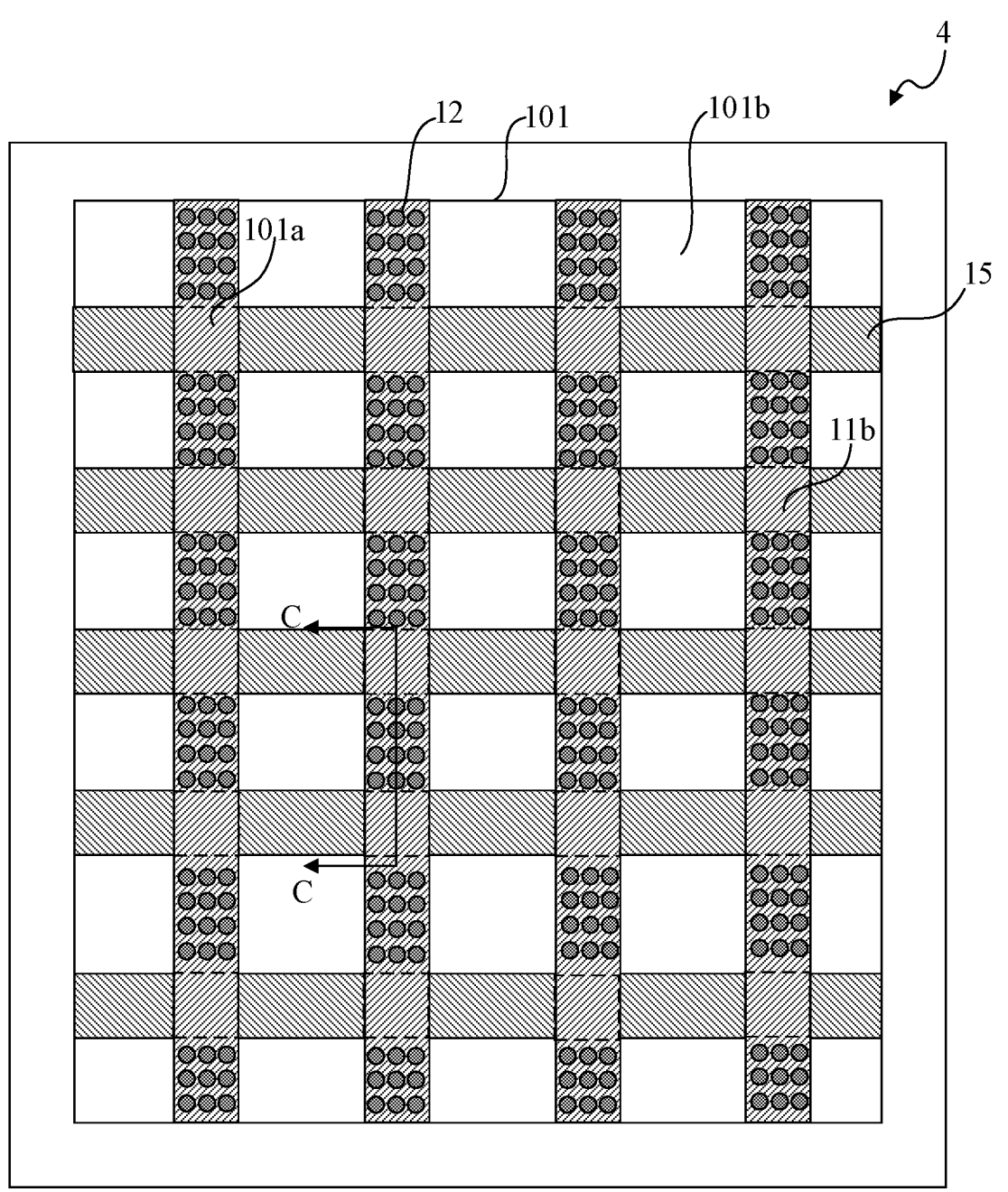
FIG. 10 is a schematic top view illustrating a transparent display panel according to another example of the present application.
Figure 11:
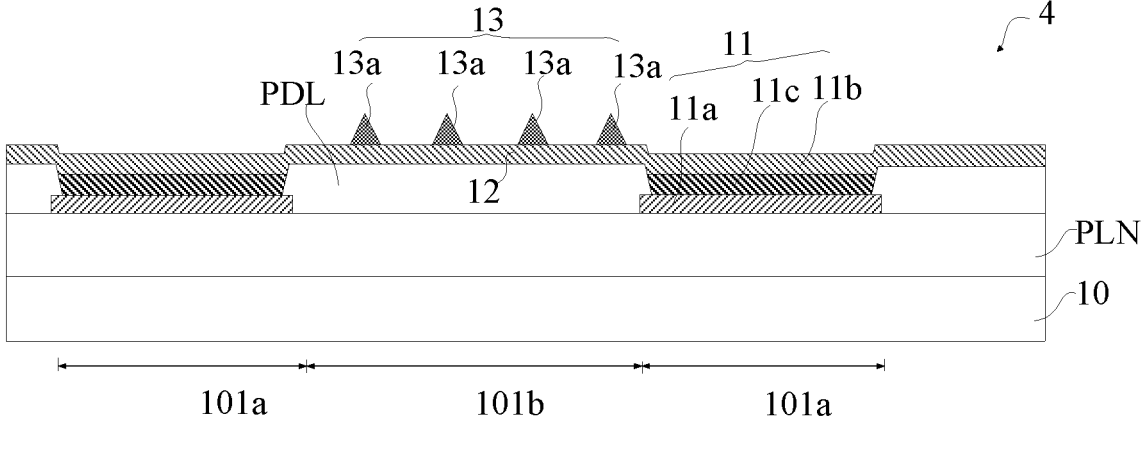
FIG. 11 is a cross-sectional view taken along a line CC in FIG. 10.

FIG. 10 is a schematic top view illustrating a transparent display panel according to another example of the present application. FIG. 11 is a cross-sectional view taken along a line CC in FIG. 10.

Referring to FIGS. 10 and 11, a transparent display panel 4 in this example has substantially the same structure as the transparent display panels 1 and 2 in FIGS. 1, 2, 7(a) and 7(b), and their differences lie only in that: in the transparent display panel 4, the light emitting mode of the pixel structures 11 is a Passive Matrix (PM) mode. And the non-pixel regions 101b in the transparent display panel 4 further have first electrode connecting portions 15, respective first electrodes 11a and corresponding first electrode connecting portions 15 located in the same first direction are connected with each other to form a strip electrode, and respective second electrodes 11b and corresponding second electrode connecting portions 12 located in the same second direction are connected with each other to form a strip electrode, where the second direction is perpendicular to the first direction.

In addition, the PM mode is also known as a passive driving mode. Voltages are applied to the pixel structures 11 by strip electrodes intersecting in rows and columns at their intersections, such that the pixel structures 11 can emit light. Therefore, there are no pixel driving circuits between the first electrodes 11a and the light transmitting substrate 10.

In FIG. 10, the first direction is a row direction, and the second direction is a column direction. In some examples, the first direction may be a column direction, and the second direction may be a row direction.

The nano-material layer 13 is provided on the second electrode connecting portions, and the nano-island structures 13a separated from each other in the nano-material layer 13 can form gratings, which can diffract incident infrared light and change its wave number to match the wave number of SPPs and thus excite the SPPs. Further, infrared light originally confined in the second electrode connecting portions 12 can be emitted, which increases the transmittance of infrared light in the non-pixel regions 101b. Rough surfaces formed by a plurality of nano-island structures 13a can scatter infrared light, which increases the transmittance of infrared light. Therefore, application requirements of Under Screen TOF can be satisfied.

The first electrodes 11a and the first electrode connecting portions 15 may be located in the same layer. Their materials may be same, and both of them may be light transmitting materials, such as at least one of ITO, IZO or IGZO.

Correspondingly, a manufacturing method of the transparent display panel 4 in this example is substantially the same as that of the transparent display panel 1 in FIGS. 1 to 2, and their differences lie only in that: in the step S2 of manufacturing the transparent display panel 4, respective second electrode connecting portions 12 located in the same second direction connect corresponding second electrodes 11b in the same second direction to form a strip electrode; and first electrode connecting portions 15 are formed in the non-pixel regions 101b, respective first electrode connecting portions 15 located in the same first direction connect corresponding first electrodes 11*a* in the same first direction to form a strip electrode, and the first electrode connecting portions 15 and the first electrodes 11*a* are formed in one process.

Figure 12:
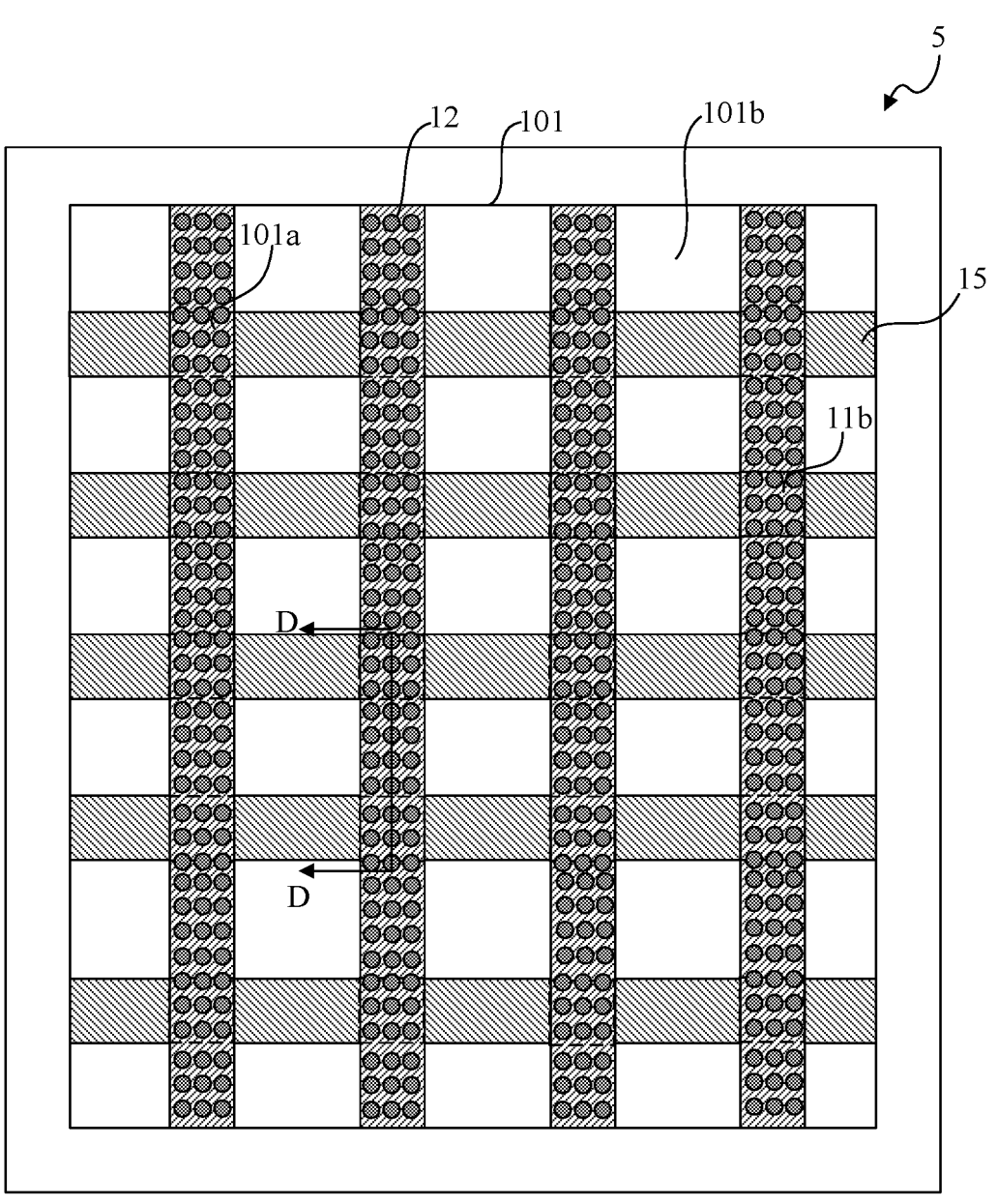
FIG. 12 is a schematic top view illustrating a transparent display panel according to another example of the present application.
Figure 13:
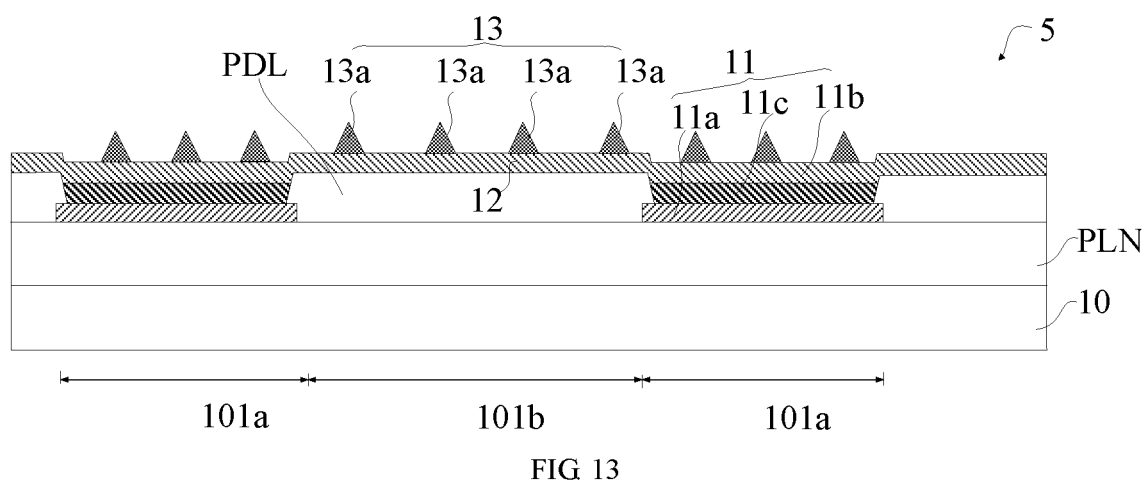
FIG. 13 is a cross-sectional view taken along a line DD in FIG. 12.

FIG. 12 is a schematic top view illustrating a transparent display panel according to another example of the present application. FIG. 13 is a cross-sectional view taken along a line DD in FIG. 12.

Referring to FIGS. 12 and 13, a transparent display panel 5 in this example has substantially the same structure as the transparent display panel 4 in FIGS. 10 to 11, and their difference lies only in that: in the transparent display panel 5, the nano-material layer 13 is provided on a side of the second electrodes 11*b* away from the light transmitting substrate 10.

The nano-material layer 13 is provided in the pixel regions 101*a*, and gratings formed by the nano-island structures 13*a* separated from each other in the nano-material layer, when the pixel structures 11 do not emit light, can diffract incident infrared light and change its wave number to match the wave number of SPPs and thus excite the SPPs. This enables infrared light originally confined in the second electrodes 11*b* to be emitted, which further increases the transmittance of infrared light in the pixel regions 101*a*. At the same time, rough surfaces formed by a plurality of nano-island structures 13*a* can scatter infrared light, which further increases the transmittance of infrared light. Therefore, application requirements of Under Screen TOF can be further satisfied.

Figure 14:
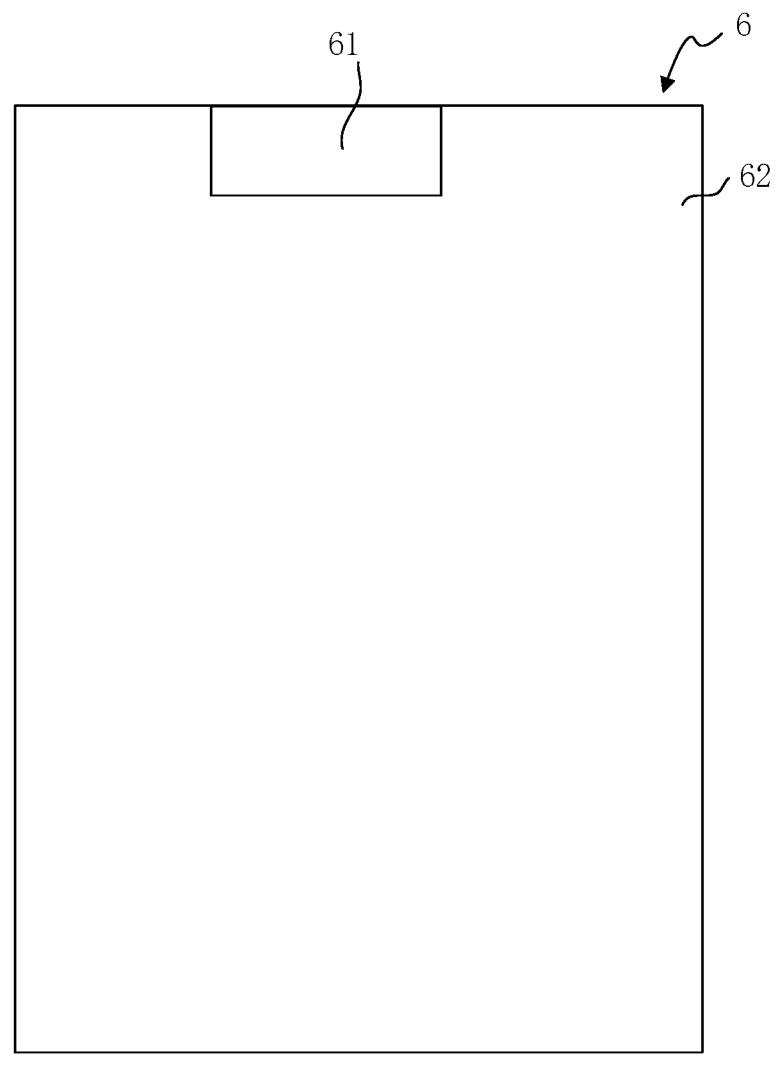
FIG. 14 is a schematic top view illustrating a display panel according to another example of the present application.

FIG. 14 is a schematic top view illustrating a display panel according to another example of the present application.

Referring to FIG. 14, a display panel 6 in this example includes a transparent display region 61 and a non-transparent display region 62, and the transparent display region 62 may be any one of the transparent display panels 1, 2, 3, 4 and 5.

The non-transparent display region 62 may include a non-transparent display panel. The non-transparent display panel is similar to the transparent display panels 1, 2, 3, 4 and 5, and their differences lie only in that: in the non-transparent display panel, materials for the first electrodes are light reflecting materials; and in addition, the nano-material layer 13 is omitted.

In some examples, a substrate of the non-transparent display panel may be an opaque substrate.

The non-transparent display panel may be assembled with the transparent display panels 1, 2, 3, 4 and 5.

In some examples, the non-transparent display region 62 and the transparent display region 61 may be located on one light transmitting substrate 10, and their differences lie only in that: in pixel structures of the non-transparent display region 62, materials for the first electrodes are light reflecting materials; and in addition, the nano-material layer 13 may or may not be omitted.

Based on the transparent display panels 1, 2, 3, 4 and 5 or the display panel 6, an example of the present application provides a display device including any one of the transparent display panels 1, 2, 3, 4 and 5 or the display panel 6. The display device may be any product or component having a display function, such as an e-book, a mobile phone, a tablet computer, a television, a notebook computer, a digital photo frame or a navigator.

It should be pointed out that in the drawings, sizes of layers and areas may be exaggerated for clarity of illustration. It will also be understood that when an element or layer is referred to as being "on" another element or layer, it can be directly on other element, or an intermediate layer may be present. In addition, it will be understood that when an element or layer is referred to as being "below" another element or layer, it can be directly below other element, or more than one intermediate layer or element may be present. It will also be understood that when a layer or element is referred to as being "between" two layers or elements, it can be the only layer between the two layers or elements, or more than one intermediate layer or element may be present. Similar reference signs indicate similar elements throughout.

In the present application, terms "first" and "second" are used only for descriptive purposes, and cannot be understood as indicating or implying relative importance.

Other embodiments of the present application will be readily apparent to those skilled in the art after considering the specification and practicing the contents disclosed herein. The present application is intended to cover any variations, uses, or adaptations of the present application, which follow the general principle of the present application and include common knowledge or conventional technical means in the art that are not disclosed in the present application. The specification and examples are to be regarded as illustrative only. The true scope and spirit of the present application are pointed out by the following claims.

It is to be understood that the present application is not limited to the precise structures that have described and shown in the drawings, and various modifications and changes can be made without departing from the scope thereof. The scope of the application is to be limited only by the appended claims.

The invention claimed is:

1. A transparent display panel provided with a TOF device below, wherein infrared light emitted from the TOF device transmits through the transparent display panel to reach an external object and is reflected by the external object, the reflected infrared light is incident on the transparent display panel and received by the TOF device, and the transparent display panel comprises:

a light transmitting substrate comprising a display region, wherein the display region comprises alternately distributed pixel regions and non-pixel regions;

pixel structures located in the pixel regions, wherein each of the pixel structures comprises: a first electrode close to the light transmitting substrate, a second electrode away from the light transmitting substrate, and a light emitting block between the first electrode and the second electrode, and one or more materials for second electrodes comprise one or more transflective materials;

second electrode connecting portions located in the non-pixel regions, wherein each of the second electrode connecting portions connects adjacent second electrodes, and one or more materials for the second electrode connecting portions are the same as the one or more materials for the second electrodes; and a nano-material layer comprising a plurality of nano-island structures separated from each other, wherein the nano-material layer is located at least on a side of the second electrode connecting portions away from the light transmitting substrate, and is configured to diffract the reflected infrared light incident on the transparent display panel and change a wave number of the reflected infrared light to match a wave number of surface plasma polaritons, so as to excite the surface plasma polaritons corresponding to infrared light to emit from surfaces of the second electrode connecting portions close to the light transmitting substrate;

wherein the nano-material layer comprising the plurality of nano-island structures separated from each other is provided on a side of the second electrodes away from the light transmitting substrate, and is configured to diffract the reflected infrared light incident on the transparent display pane and change a wave number of the reflected infrared light to match a wave number of surface plasma polaritons, so as to excite surface plasma polaritons corresponding to infrared light to emit from surfaces of the second electrodes close to the light transmitting substrate when the pixel structures do not emit light;

wherein a transmittance of the reflected infrared light incident on the transparent display panel is greater than a transmittance of visible light incident on the transparent display panel.

2. The transparent display panel according to claim 1, wherein the one or more materials for the second electrode connecting portions are different from one or more materials for the nano-material layer; the one or more materials for the second electrode connecting portions comprise at least one of magnesium, silver or aluminum; the one or more materials for the nano-material layer comprise at least one of gold, silver, lead, aluminum or magnesium.

3. The transparent display panel according to claim 1, wherein the nano-island structures are periodically or non-periodically distributed; and/or the nano-island structures are cuboids, cubes, cones, prismoids or hemispheroids.

4. The transparent display panel according to claim 1, wherein a light emitting mode of the pixel structures is an Active Matrix mode, and the second electrodes and the second electrode connecting portions are connected with each other to form a planar electrode.

5. The transparent display panel according to claim 1, wherein a light emitting mode of the pixel structures is a Passive Matrix mode; and the non-pixel regions comprise first electrode connecting portions, respective first electrodes and corresponding first electrode connecting portions located in a same first direction are connected with each other to form a strip electrode, and respective second electrodes and corresponding second electrode connecting portions located in a same second direction are connected with each other to form a strip electrode, wherein the second direction is perpendicular to the first direction.

6. A display panel, comprising: a transparent display region and a non-transparent display region, wherein the transparent display region comprises a transparent display panel provided with a TOF device below, wherein infrared light emitted from the TOF device transmits through the transparent display panel to reach an external object and is reflected by the external object, the reflected infrared light is incident on the transparent display panel and received by the TOF device, and the transparent display panel comprises:

a light transmitting substrate comprising a display region, wherein the display region comprises alternately distributed pixel regions and non-pixel regions;

pixel structures located in the pixel regions, wherein each of the pixel structures comprises: a first electrode close to the light transmitting substrate, a second electrode away from the light transmitting substrate, and a light emitting block between the first electrode and the second electrode, and one or more materials for second electrodes comprise one or more transflective materials;

second electrode connecting portions located in the non-pixel regions, wherein each of the second electrode connecting portions connects adjacent second electrodes, and one or more materials for the second electrode connecting portions are the same as the one or more materials for the second electrodes; and a nano-material layer comprising a plurality of nano-island structures separated from each other, wherein the nano-material layer is located at least on a side of the second electrode connecting portions away from the light transmitting substrate, and is configured to diffract the reflected infrared light incident on the transparent display panel and change a wave number of the reflected infrared light to match a wave number of surface plasma polaritons, so as to excite the surface plasma polaritons corresponding to infrared light to emit from surfaces of the second electrode connecting portions close to the light transmitting substrate;

wherein the nano-material layer comprising the plurality of nano-island structures separated from each other is provided on a side of the second electrodes away from the light transmitting substrate, and is configured to diffract the reflected infrared light incident on the transparent display pane and change a wave number of the reflected infrared light to match a wave number of surface plasma polaritons, so as to excite surface plasma polaritons corresponding to infrared light to emit from surfaces of the second electrodes close to the light transmitting substrate when the pixel structures do not emit light;

wherein a transmittance of the reflected infrared light incident on the transparent display panel is greater than a transmittance of visible light incident on the transparent display panel.

7. A method of manufacturing a transparent display panel provided with a TOF device below, wherein infrared light emitted from the TOF device transmits through the transparent display panel to reach an external object and is reflected by the external object, the reflected infrared light is incident on the transparent display panel and received by the TOF device, and the method comprises:

providing a light transmitting substrate comprising a display region, wherein the display region comprises alternately distributed pixel regions and non-pixel regions;

forming pixel structures in the pixel regions, and forming second electrode connecting portions in the non-pixel regions, wherein each of the pixel structures comprises a first electrode close to the light transmitting substrate, a second electrode away from the light transmitting substrate, and a light emitting block between the first electrode and the second electrode, and one or more materials for second electrodes comprise one or more transflective materials, each of the second electrode connecting portions connects adjacent second electrodes, and the second electrode connecting portions and the second electrodes are formed in one process; and forming a nano-material layer at least on a side of the second electrode connecting portions away from the light transmitting substrate, wherein the nano-material layer comprises a plurality of nano-island structures separated from each other, and is configured to diffract the reflected infrared light incident on the transparent display panel and change a wave number of the reflected infrared light to match a wave number of surface plasma polaritons, so as to excite the surface plasma polaritons corresponding to infrared light to emit from surfaces of the second electrode connecting portions close to the light transmitting substrate;

wherein the method further comprises forming the nano-material layer comprising the plurality of nano-island structures separated from each other on a side of the second electrodes away from the light transmitting substrate, and wherein the nano-material layer is configured to diffract the reflected infrared light incident on the transparent display pane and change a wave number of the reflected infrared light to match a wave number of surface plasma polaritons, so as to excite surface plasma polaritons corresponding to infrared light to emit from surfaces of the second electrodes close to the light transmitting substrate when the pixel structures do not emit light;

wherein a transmittance of the reflected infrared light incident on the transparent display panel is greater than a transmittance of visible light incident on the transparent display panel.

8. The method of manufacturing a transparent display panel according to claim 7, wherein the nano-island structures are formed by evaporation, etching or laser ablation.

9. The method of manufacturing a transparent display panel according to claim 7, wherein one or more materials for the second electrode connecting portions are different from one or more materials for the nano-material layer; the one or more materials for the second electrode connecting portions comprise at least one of magnesium, silver or aluminum; and the one or more materials for the nano-material layer comprise at least one of gold, silver, lead, aluminum or magnesium.

10. The method of manufacturing a transparent display panel according to claim 7, wherein the nano-island structures are periodically or non-periodically distributed; and/or the nano-island structures are cuboids, cubes, cones, prismoids or hemispheroids.

11. The method of manufacturing a transparent display panel according to claim 7, wherein a light emitting mode of the pixel structures is an Active Matrix mode; and forming the pixel structures in the pixel regions, and forming the second electrode connecting portions in the non-pixel regions comprises:

connecting the second electrodes with the second electrode connecting portions to form a planar electrode.

12. The method of manufacturing a transparent display panel according to claim 7, wherein a light emitting mode of the pixel structures is a Passive Matrix mode; and forming the pixel structures in the pixel regions, and forming the second electrode connecting portions in the non-pixel regions comprises:

forming first electrode connecting portions in the non-pixel regions, so that respective first electrodes and corresponding first electrode connecting portions located in a same first direction are connected with each other to form a strip electrode, and forming the second electrode connecting portions in the non-pixel regions, so that respective second electrodes and corresponding second electrode connecting portions located in a same second direction are connected with each other to form a strip electrode, wherein the second direction is perpendicular to the first direction.

13. The transparent display panel according to claim 2, wherein a light emitting mode of the pixel structures is an Active Matrix mode, and the second electrodes and the second electrode connecting portions are connected with each other to form a planar electrode.

14. The transparent display panel according to claim 3, wherein a light emitting mode of the pixel structures is an Active Matrix mode, and the second electrodes and the second electrode connecting portions are connected with each other to form a planar electrode.

15. The transparent display panel according to claim 2, wherein a light emitting mode of the pixel structures is a Passive Matrix mode; and the non-pixel regions comprise first electrode connecting portions, respective first electrodes and corresponding first electrode connecting portions located in a same first direction are connected with each other to form a strip electrode, and respective second electrodes and corresponding second electrode connecting portions located in a same second direction are connected with each other to form a strip electrode, wherein the second direction is perpendicular to the first direction.

16. The transparent display panel according to claim 3, wherein a light emitting mode of the pixel structures is a Passive Matrix mode; and the non-pixel regions comprise first electrode connecting portions, respective first electrodes and corresponding first electrode connecting portions located in a same first direction are connected with each other to form a strip electrode, and respective second electrodes and corresponding second electrode connecting portions located in a same second direction are connected with each other to form a strip electrode, wherein the second direction is perpendicular to the first direction.

\* \* \* \* \*